United States Patent [19]
Kawashima et al.

[11] Patent Number: 6,153,918
[45] Date of Patent: Nov. 28, 2000

[54] SEMICONDUCTOR DEVICE WITH IMPROVED PLANARITY AND REDUCED PARASITIC CAPACITANCE

[75] Inventors: Hiroshi Kawashima; Masakazu Okada; Keiichi Yamada; Keiichi Higashitani, all of Hyogo, Japan

[73] Assignee: Mitsubishi Denki Kabushiki Kaisha, Tokyo, Japan

[21] Appl. No.: 09/138,017

[22] Filed: Aug. 21, 1998

[30]     Foreign Application Priority Data

Apr. 20, 1998 [JP] Japan ................................ 10-109535

[51] Int. Cl.⁷ ..................................................... H01L 29/00
[52] U.S. Cl. ........................... 257/510; 257/374; 257/396; 257/397; 257/390; 257/333; 257/506; 438/296; 438/425; 438/183
[58] Field of Search ...................................... 257/510, 374, 257/396, 397, 506, 649, 380, 333; 438/183, 296, 425

[56]                 References Cited

U.S. PATENT DOCUMENTS

| | | |
|---|---|---|
| 4,746,963 | 5/1988 | Uchida et al. . |
| 4,853,343 | 8/1989 | Uchida et al. . |
| 4,923,821 | 5/1990 | Namose ..................... 257/510 |
| 5,084,402 | 1/1992 | Uchida et al. . |
| 5,200,348 | 4/1993 | Uchida et al. . |
| 5,750,433 | 5/1998 | Jo ............................. 438/424 |
| 5,923,969 | 7/1999 | Oyamatsu ................... 438/183 |

FOREIGN PATENT DOCUMENTS

| | | |
|---|---|---|
| 59-43545 | 3/1982 | Japan . |
| 60-98642 | 6/1985 | Japan . |
| 62-158345 | 7/1987 | Japan . |
| 6-112308 | 9/1992 | Japan . |
| 9-181159 | 7/1997 | Japan . |

*Primary Examiner*—Matthew Smith
*Assistant Examiner*—B. Keshaven
*Attorney, Agent, or Firm*—McDermott, Will & Emery

[57]                   ABSTRACT

In a semiconductor device and a method of manufacturing the same, a dummy region which can suppress occurrence of a parasitic capacity can be provided for reducing a difference in level without increasing manufacturing steps in number. A semiconductor substrate is provided at its main surface with an isolation region formed by a trench, and a dummy region leaving the main surface is formed in the isolation region for the purpose of reducing an influence by the difference in level in a later step. The dummy region includes p- and n-type impurity regions each extending a predetermined depth from the surface. Since a pn junction occurs at the bottom of the impurity region, a depletion layer spreads in the pn junction, and thereby reduces a parasitic capacity between the dummy region and a conductive interconnection located in a crossing direction at a higher position. The impurity regions and source/drain regions of p- and n-channel transistors in active regions are simultaneously formed by impurity implantation.

8 Claims, 11 Drawing Sheets

SEMICONDUCTOR DEVICE WITH IMPROVED PLANARITY AND REDUCED PARASITIC CAPACITANCE

BACKGROUND OF THE INVENTION

1. Field of the Invention

The present invention relates to a semiconductor device and a method of manufacturing the same, and particularly a semiconductor device having a dummy pattern for reducing a difference in level, which appears on a surface of a filling film in a later step due to a trench isolation region of a small aspect ratio, and thereby improving a flatness of the surface as well as a method of manufacturing the same.

2. Description of the Background Art

As a result of polishing such as CMP (Chemical Mechanical Polishing) in a conventional process of manufacturing a semiconductor memory device, a difference in level appears on a surface of a filling film in a later step due to a trench isolation region of a small aspect ratio. For reducing this difference in level, it is well known to form a dummy pattern in the isolation region of the small aspect ratio.

For example, shallow trench isolation, which has been actually used in recent years, is implemented such that a portion which is not an active region entirely forms a wide trench of a small aspect ratio providing an isolation region with. This trench having a small aspect ratio causes a difference in level on the isolation region. A problem caused by this level difference will now be described below with reference to a CMOS (Complementary Metal Oxide Semiconductor) shown in FIG. 10, and then a conventional manner for overcoming the problem will be described.

Figure 10:
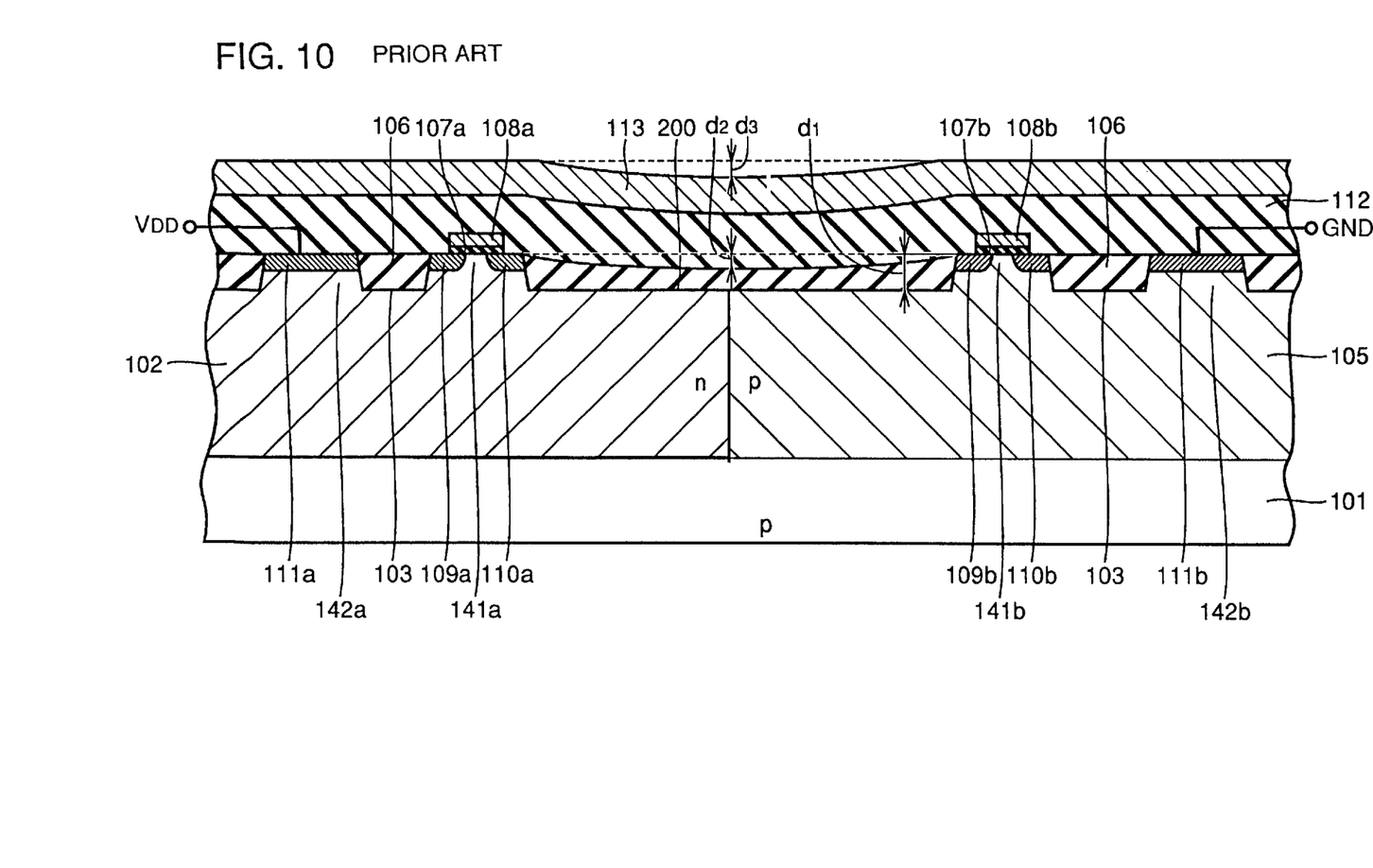
FIG. 10 shows a conventional structure in which a filling film and an interlayer oxide film are formed without forming a dummy region having an electrical conductivity on a wide isolation portion provided at a Si substrate for trench isolation.

In this CMOS, as shown in FIG. 10, a p-type Si substrate 101 is provided at its upper portion with an n-well region 102 having a predetermined depth from the surface of p-type Si substrate 101. A p-well region 105 having a predetermined depth from the surface of Si substrate 101 is formed in a region of Si substrate 101 right to n-well 102. As a result of trench isolation, convex regions 141a, 142a, 141b and 142b are formed, and concave regions 103 are formed between convex regions 141a and 142a and between convex regions 141b and 142b, respectively. Active regions, i.e., source/drain 109a and 110a as well as a gate oxide film 107a and a gate electrode layer 108a are formed on the upper portion of convex region 141a in n-well region 102. Source/drain 109b and 110b as well as gate oxide film 107b and gate electrode 108b are formed on the upper portion of convex region 141b in p-well 105. Concave regions 103 and a wide trench isolation region 200 are filled with filling oxide films 106. Source/drain 109a and 110a, gate oxide film 107a, gate electrode 108a, source/drain 109b and 110b, gate oxide film 107b and gate electrode 108b are covered with an interlayer oxide film 112. An interconnection layer 113 is formed on interlayer oxide film 112.

In the conventional CMOS having the above structure, a difference d1 in level is present between the bottom of wide trench isolation region 200 and tops of convex regions 141a and 141b, and trench isolation region 200 has a small aspect ratio. Therefore, filling oxide film 106 deposited in trench isolation region 200 has a concave top surface. After the deposition, processing such as CMP or etch-back is effected on the concave surface of oxide film 106 for flattening the same. However, the surface still has a concave form even after the flattening processing due to a significant influence of the concave form of the surface before the processing. As a result, a difference d2 in level is present between the highest and lowest portions of the concave surface of filling oxide film 106 formed in trench isolation region 200. In the final structure, interlayer oxide film 112 is formed on the concave filling oxide film 106 having the level difference d2, and interconnection layer 113 is formed on interlayer oxide film 112. The concave form still remains in this final structure, and a difference d3 in level is likewise present between the highest and lowest portions.

Figure 11:
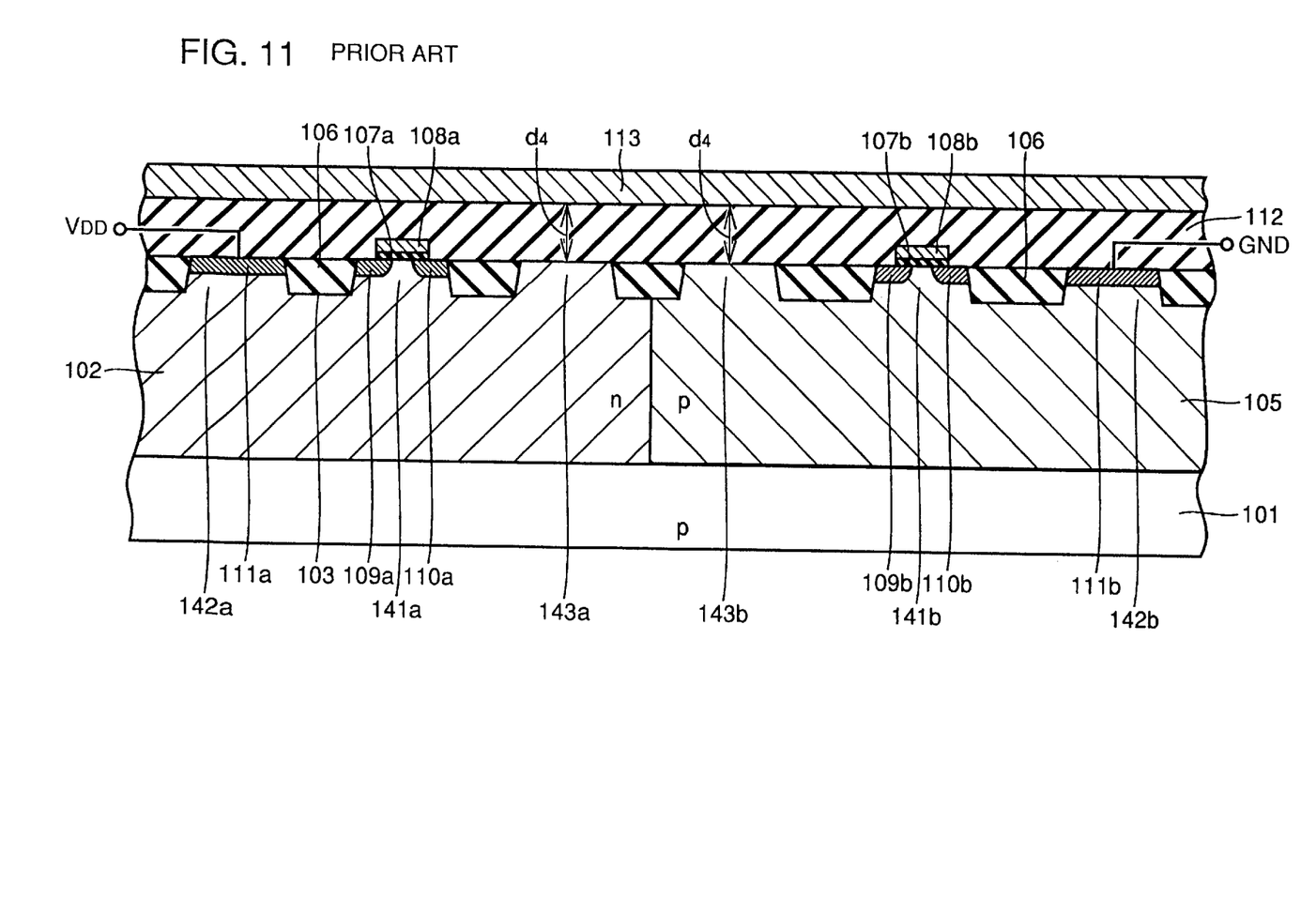
FIG. 11 shows a conventional structure in which an interconnection is formed above dummy regions having an electrical conductivity with an interlayer oxide film therebetween.

For overcoming the above problem, a manner shown in FIG. 11 may be employed in the prior art. In this manner, convex regions 143a and 143b shown in FIG. 11 are formed in a region, which corresponds to isolation region 200 in FIG. 10 having a small aspect ratio, simultaneously with convex regions 141a and 141b carrying transistors and convex regions 142a and 142b forming electrodes connected to interconnections. In other words, as shown in FIG. 11, isolation regions 103 leaving convex regions 143a and 143b are formed for trench isolation in the region corresponding to isolation region 200 shown in FIG. 10. This manner can suppress occurrence of level difference d3 which may appear after formation of interlayer oxide film 112, and can form interconnection layer 113 on substantially flat interlayer oxide film 112, as shown in FIG. 11.

However, convex regions 143a and 143b shown in FIG. 11, which are formed in the hollow region 200 of a small aspect ratio shown in FIG. 10 have an electrical conductivity. Therefore, in the structure shown in FIG. 11 wherein interconnection 113 crosses convex regions 143a and 143b under the same, unnecessary capacitor structures are formed between interconnection 113 and convex regions 143a and 143b, if a distance d4 between interconnection 113 and each of convex regions 143a and 143b is short.

Although not shown, convex regions 143a and 143b may overlap with gate electrodes of transistors located above them. In this case, an unnecessary capacitor structure is formed over a large area along the gate interconnection because the gate oxide film is thin. This results in increase in parasitic capacity and therefore deterioration of electrical characteristics so that a percent defective of the transistors increases, or a burn-in time for screening increases.

In the conventional structure provided with dummy convex regions as described above, interconnections arranged at a higher level increase the parasitic capacity and thus deteriorate the electrical characteristics so that good products cannot be produced.

SUMMARY OF THE INVENTION

An object of the invention is to provide a structure of a semiconductor device and a method of manufacturing the same, which can reduce an electrical influence exerted, as a result of increase in parasitic capacity, by a dummy convex region having an electrical conductivity on a transistor and/or a conductive layer located above the dummy convex region in a crossing direction.

In a semiconductor device according to an aspect of the invention, a semiconductor substrate is provided at its main surface with an isolation region isolating an active region, trench isolation provided with a trench extending a predetermined depth from the main surface is provided in the isolation region, and a dummy region leaving the main surface is formed in the wide isolation region for the purpose of reducing an influence by a difference in level in a later step of forming a semiconductor element on the main surface. Particularly, the dummy region includes a first impurity diffusion region extending a predetermined depth from the main surface and having a predetermined conductivity, and a second impurity diffusion region formed under the first impurity diffusion region, being in contact with the bottom surface of the first impurity diffusion region and having a predetermined conductivity type.

In the above structure, the first and second impurity regions may have opposite conductivity types. When an interconnection or the like is formed in a later step, a difference in potential occurs between the first impurity diffusion region and the interconnection or the like so that a depletion layer is formed at a junction between the first and second impurity regions. Thereby, an unnecessary capacitor structure formed therebetween is substantially equivalent to a structure including the second impurity region and the depletion layer connected together in series. Assuming that the second impurity region has an electric capacity of C1, and the depletion layer has an electric capacity of C2, the sum of these electric capacities is equal to C1·C2/(C1+C2) which is smaller than the electric capacity C1 of the second impurity region because of C2(C1+C2)<1. In the structure which includes the interconnection or the like extending in the upper position, therefore, it is possible to suppress deterioration of electrical characteristics which may be caused by a parasitic capacity occurring between the interconnection and the dummy region having an electrical conductivity.

Alternatively, the first and second impurity regions may have the same conductivity type. In this case, the first and second impurity regions are connected together in series so that a well resistance can be lowered, and a resistance against the latch-up can be improved. As a result, it is possible to reduce an electrical influence exerted by the dummy region having an electrical conductivity in the structure having an interconnection or the like at the upper position.

According to another aspect of the invention, a method of manufacturing a semiconductor device includes the steps of forming a trench having a predetermined depth from a main surface of a semiconductor substrate in an isolation region isolating an active region in the main surface of the semiconductor substrate while remaining the main surface of a predetermined dummy region for reducing an influence by a difference in level in a later step; and implanting impurity of a predetermined conductivity type into the active region for forming an impurity diffusion region, wherein the step of implanting the impurity includes the step of forming a dummy impurity diffusion region extending a predetermined depth from the main surface of the dummy region by implanting the same impurity into the dummy region simultaneously with the implantation of the impurity into the active region.

According to the above manufacturing method, the step of implanting the impurity includes the step of implanting the impurity of the conductivity type, which is the same as or opposite to that of the impurity implanted into the active region, into the dummy region simultaneously with the implantation of the impurity into the active region. Thereby, the dummy region can be formed without increasing the steps in number.

According to the method of manufacturing the semiconductor device of the above aspect, the step of implanting the impurity may include the step of implanting the impurity of the conductivity type opposite to that of the dummy region in the main surface of the semiconductor substrate for forming an impurity diffusion region extending a predetermined depth from the main surface and having the conductivity type opposite to that of an underlying region.

According to the manufacturing method including the above step, the impurity of the conductivity type opposite to that of the dummy region in the main surface of the semiconductor substrate is implanted so that a pn junction can be formed by junction surfaces of the impurity and the dummy region.

In the method of manufacturing the semiconductor device according to the foregoing aspect, the step of implanting the impurity may include the step of implanting the impurity of the same conductivity type as that of the dummy region in the main surface of the semiconductor substrate for forming an impurity diffusion region extending a predetermined depth from the main surface and having an impurity concentration higher than that of an underlying region.

According to the manufacturing method including the above step, the impurity of the same conductivity type as that of the dummy region in the main surface of the semiconductor substrate is implanted so that junction surfaces of the impurity and the dummy region can be the surfaces having different impurity concentrations and the same conductivity type.

In a semiconductor device according to a further aspect of the invention, a semiconductor substrate is provided at its main surface with an isolation region isolating an active region, trench isolation provided with a trench extending a predetermined depth from the main surface is provided in the isolation region, a dummy region leaving the main surface is formed in the isolation region without forming a trench for the purpose of reducing an influence by a difference in level in a later step of forming a semiconductor element on the main surface. Particularly, the dummy region includes an oxide film formed by oxidizing the surface of the dummy region and covering the surface of the dummy region.

In this structure, an interconnection or the like, which is formed at an upper position, and the dummy region form an unnecessary capacitor structure, but electrodes of this capacitor structure are spaced from each other by a long distance and are opposed to each other through a small area because the oxide film has an insulating property. As a result, it is possible to suppress deterioration of electrical characteristics which may be caused by increase in parasitic capacity of the interconnection provided by the dummy region having the electrical conductivity.

According to another aspect of the invention, a method of manufacturing a semiconductor device includes the steps of forming a trench having a predetermined depth from a main surface of a semiconductor substrate in an isolation region isolating an active region in the main surface of the semiconductor substrate while remaining a main surface of a predetermined dummy region for reducing an influence by a difference in level in a later step; and forming an oxide film covering the surface of the dummy region by oxidizing the dummy region using a mask covering a region other than the dummy region.

Owing to the above steps, the dummy region having the electrical conductivity can be oxidized, and thereby a capacitor structure formed between an interconnection and the dummy region having the electrical conductivity can have electrodes spaced from each other by an increased distance and opposed to each other through a reduced area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 6:
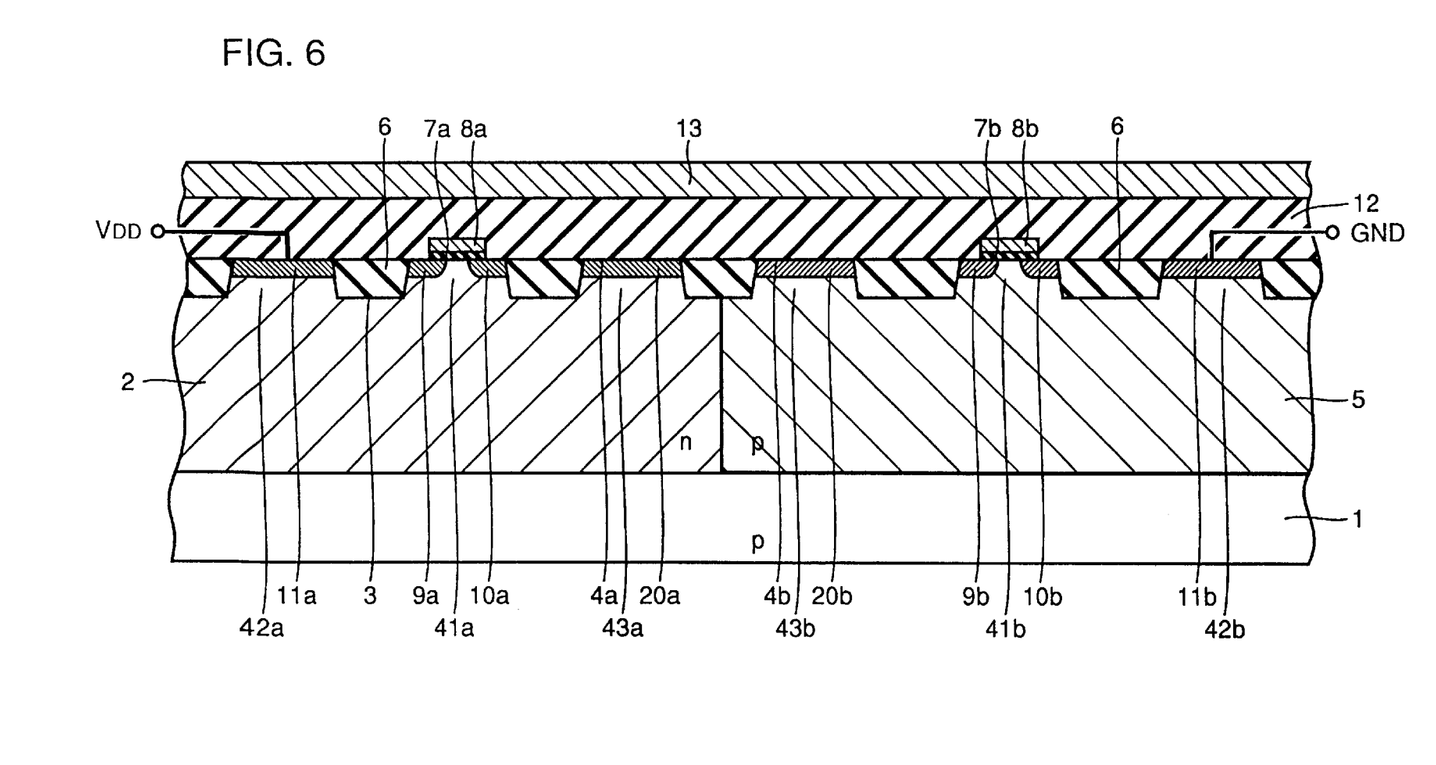
FIG. 6 shows a sectional structure in a step of forming the semiconductor device of the embodiment 1 of the invention having the dummy regions, and particularly shows a structure in which an interlayer oxide film is formed over the filling oxide films, the convex regions doped with impurity and the gate electrodes, and an interconnection layer is formed on the interlayer oxide film.

A semiconductor memory device of an embodiment 1 of the invention will be described below with reference to FIG. 6 showing by way of example a CMOS to which the invention is applied.

In the semiconductor device of this embodiment shown in FIG. 6, p-type semiconductor substrate 1 is provided with an n-well 2 having a predetermined depth from a main surface of p-type semiconductor substrate 1. A p-well 5 is formed in a region right to n-well 2. Concave regions 3 for trench isolation as well as convex regions 41a, 42a, 43a, 41b, 42b and 43b are formed. Convex regions 41a and 41b are provided for forming transistors thereon. Convex regions 42a and 42b are connected to electrodes. Convex regions 43a and 43b form dummy regions for reducing a difference in level. Gate oxide films 7a and 7b as well as gate electrodes 8a and 8b are formed on convex regions 41a and 41b, respectively. Source/drain 9a and 10a are formed in convex region 41a which is located at the upper portion of n-well 2 for forming the transistor. Source/drain 9b and 10b are formed in convex region 41b which is located at the upper portion of p-well 5 for forming the transistor. n- and p-type impurity regions 11a and 11b are formed at the upper portions of convex regions 42a and 42b forming terminals to which potentials are applied, respectively. p- and n-type impurity regions 20a and 20b are formed at the upper portions of convex regions 43a and 43b forming the dummy regions, respectively. Each concave region 3 is filled with a filling oxide film 6. There is formed an interlayer oxide film 12 covering convex regions 41a, 42a, 43a, 41b, 42b and 43b, source/drain 9a and 10a, source/drain 9b and 10b, gate oxide films 7a and 7b, and gate electrodes 8a and 8b. An electrically conductive interconnection 13 is formed on the top surface of interlayer oxide film 12.

According to the semiconductor device of this embodiment thus constructed, when differences in potential occur between conductive interconnection 13, which crosses and extends above p- and n-type impurity regions 20a and 20b, and convex regions 43a and 43b, depletion layers are formed at pn junctions between p-type impurity region 20a and n-well 2, and between n-type impurity region 20b and p-well 5, respectively. Therefore, unnecessary capacitor structures formed between conductive interconnection 13, and convex regions 43a and 43b are substantially equivalent to structures in which p- and n-type impurity regions 20a and 20b are connected in series to the depletion layers formed at the pn junctions, respectively. Assuming that an electrostatic capacity of C1 is present between conductive interconnection 13 and each of p- and n-type impurity regions 20a and 20b, and that each of the foregoing depletion layers has an electrostatic capacity of C2, the sum of these electrostatic capacities equals to C1·C2/(C1+C2), and is smaller than electrostatic capacity C1 of each of p- and n-type impurity regions 20a and 20b because of C2/(C1+C2)<1. Therefore, it is possible to reduce a parasitic capacity which is formed with respect to the interconnection crossing p- and n-type impurity regions 20a and 20b located under the interconnection.

A method of manufacturing the semiconductor device of this embodiment will be described below.

Figure 1:
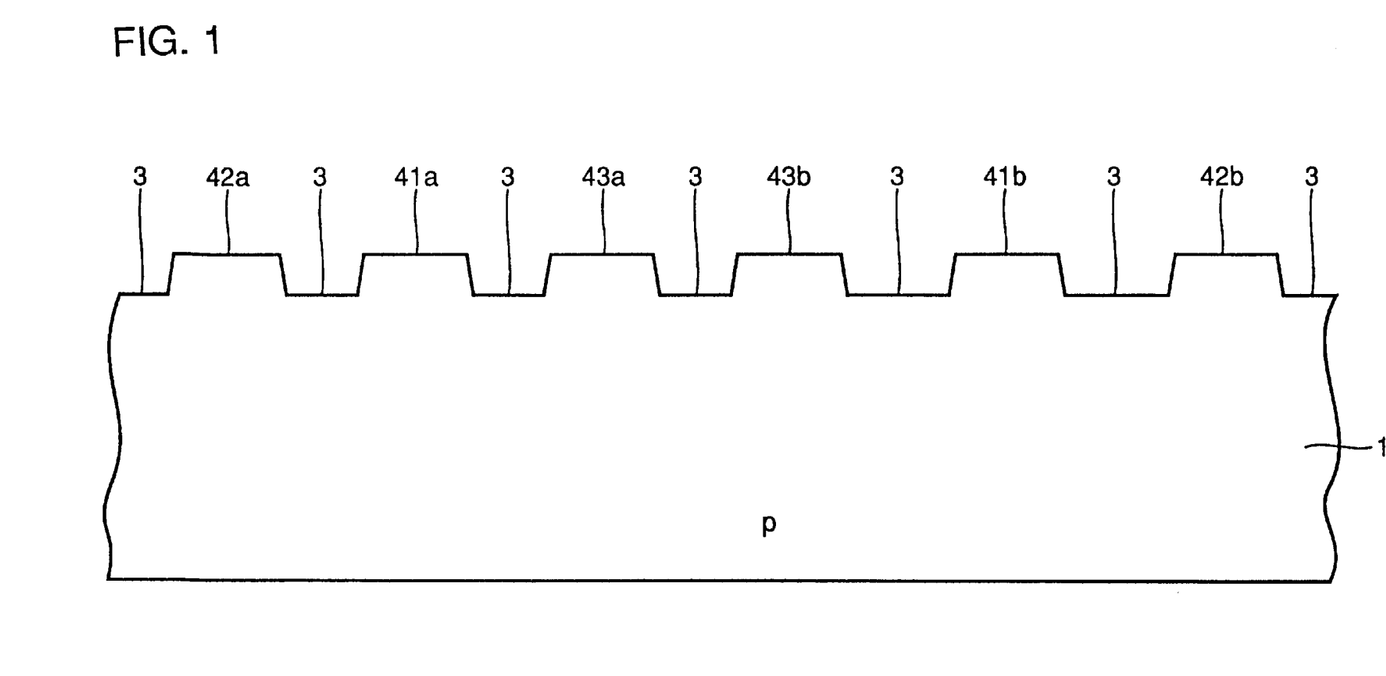
FIG. 1 shows a sectional structure in a step of forming a semiconductor device of an embodiment 1 of the invention having dummy regions, and particularly shows a structure in which trenches extending a predetermined depth from a main surface of a Si substrate is formed to provide convex and concave regions.
Figure 2:
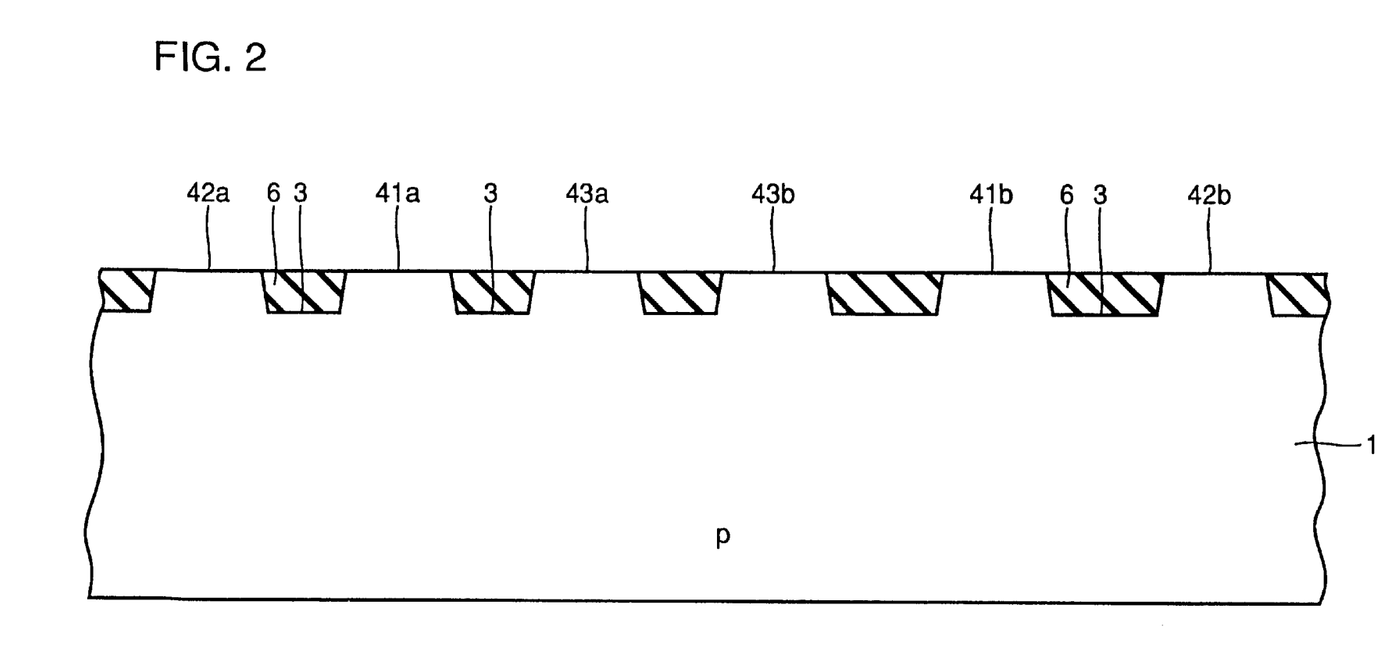
FIG. 2 shows a sectional structure in a step of forming the semiconductor device of the embodiment 1 of the invention having the dummy regions, and particularly shows a structure in which filling oxide films are formed in the concave regions.
Figure 3:
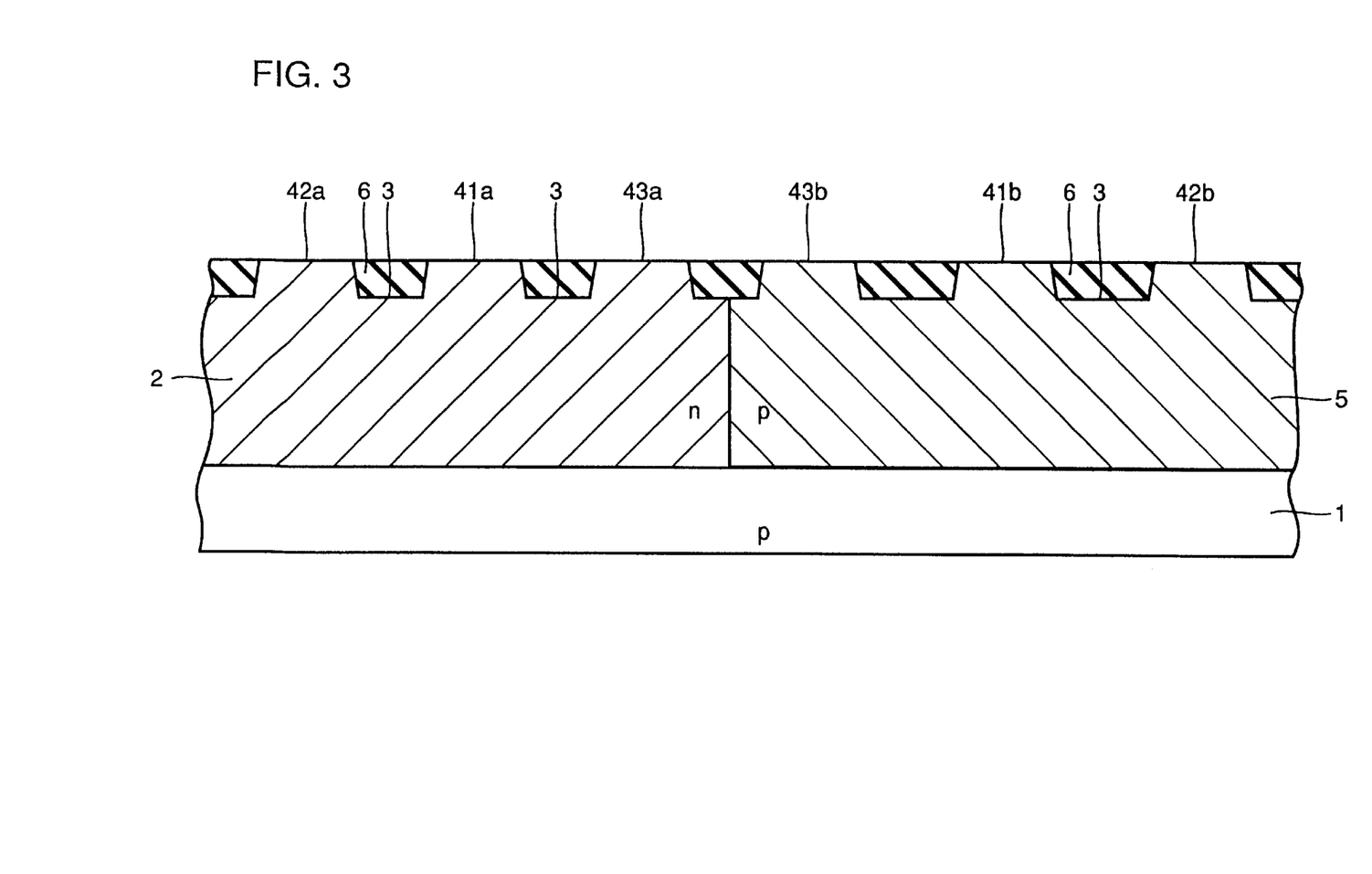
FIG. 3 shows a sectional structure in a step of forming the semiconductor device of the embodiment 1 of the invention having the dummy regions, and particularly shows a structure in which n- and p-wells having a predetermined depth from the main surface of the Si substrate are formed.

First, as shown in FIG. 1, anisotropic etching is effected to form various regions at the upper portion of the semiconductor substrate 1. These regions are concave regions 3 which form trenches for isolating the active regions, regions 41a and 41b forming the active regions, convex regions 42a and 42b forming the electrodes and convex regions 43a and 43b which form the dummy regions for reducing a difference in level. Then, filling oxide films 6 are formed as shown in FIG. 2, and polishing and smoothing are performed by the CMP to expose convex regions 41a, 42a, 43a, 41b, 42b and 43b. A region right to the center of concave region 3 between convex regions 43a and 43b is masked, and n-type impurity such as phosphorus is implanted into semiconductor substrate 1 so that n-well 2 extending a predetermined depth from the main surface of semiconductor substrate 1 is formed in the region including convex regions 41a, 42a and 43a, as shown in FIG. 3. A region left to the center of concave region 3 between convex regions 43a and 43b is masked, and p-type impurity such as boron is implanted into semiconductor substrate 1 so that p-well 5 extending a predetermined depth from the main surface of semiconductor substrate 1 is formed in the region including convex regions 41b, 42b and 43b, as shown in FIG. 3.

Figure 4:
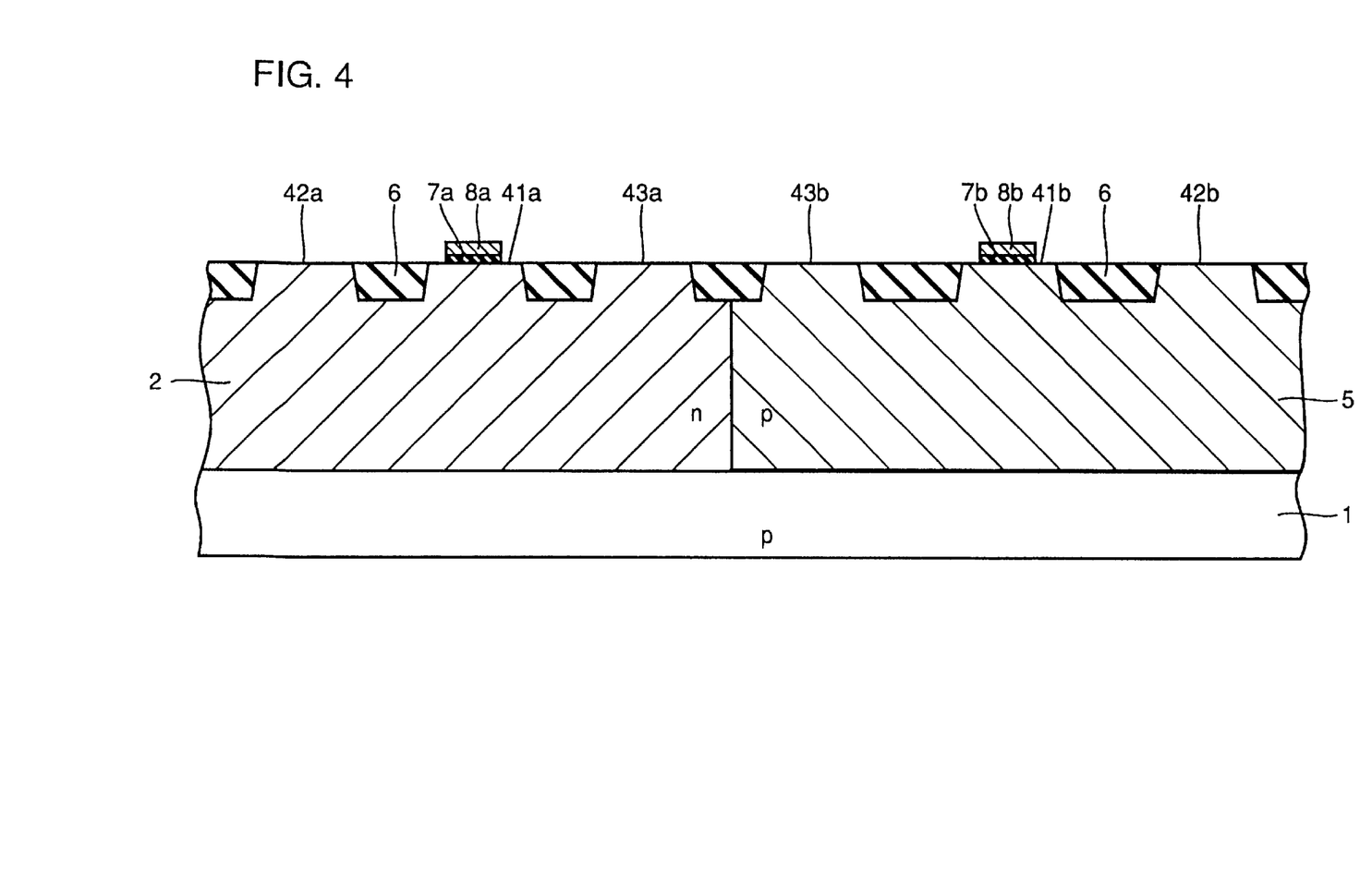
FIG. 4 shows a sectional structure in a step of forming the semiconductor device of the embodiment 1 of the invention having the dummy regions, and particularly shows a structure in which gate oxide films and gate electrodes are formed at the convex regions forming transistors.
Figure 5:
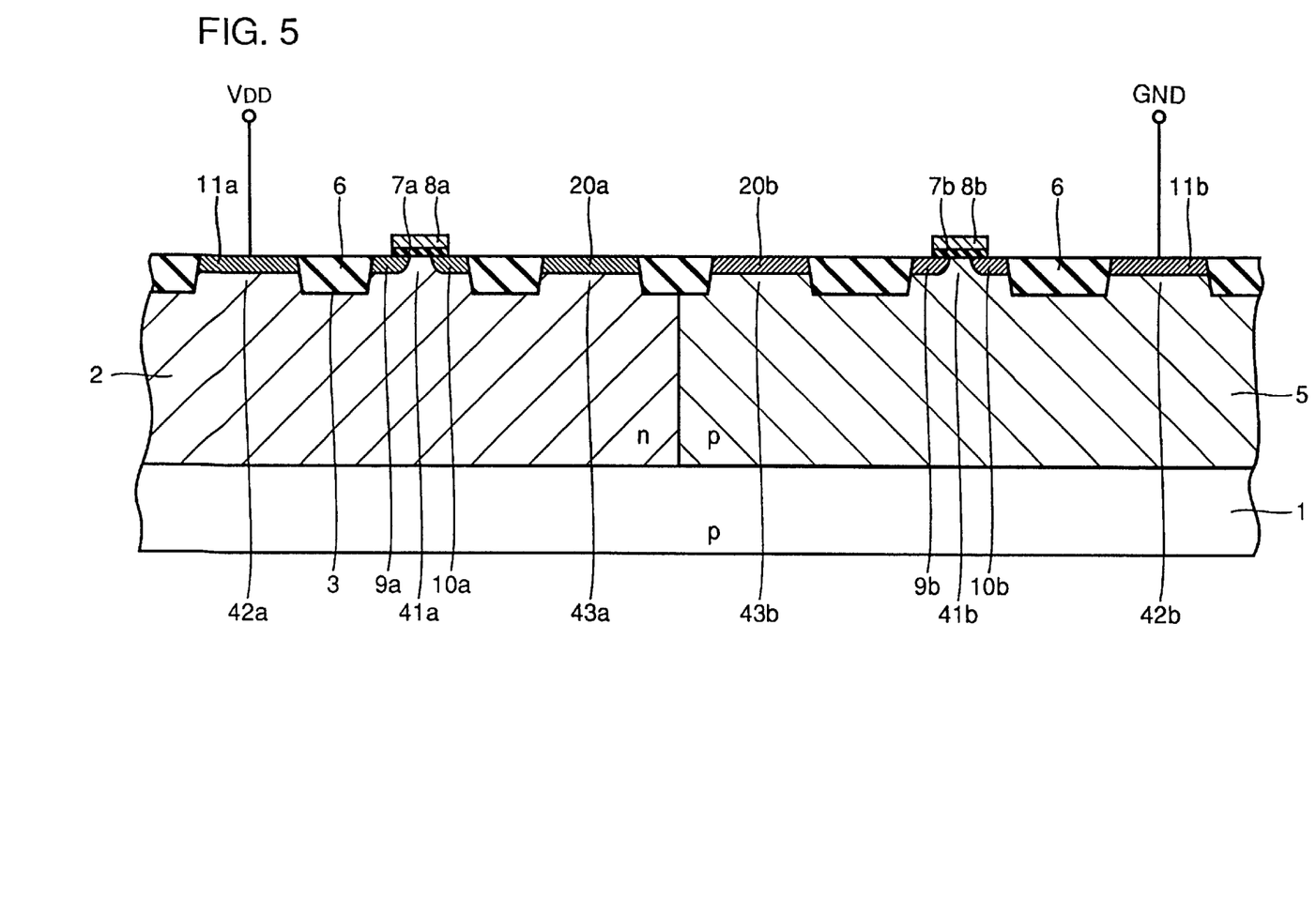
FIG. 5 shows a sectional structure in a step of forming the semiconductor device of the embodiment 1 of the invention having the dummy regions, and particularly shows a structure in which impurity regions are formed at the convex regions by processing using the filling oxide films and the gate electrodes as a mask.

As shown in FIG. 4, gate oxide films 7a and 7b, and gate electrodes 8a and 8b are formed on convex regions 41a and 41b, respectively. Thereafter, the top surfaces of convex regions 41a, 42b and 43a are masked, and n-type impurity such as phosphorus is implanted into semiconductor substrate 1 so that $n^+$-source/drain 9b and 10b are formed at the surface of convex region 41b on p-well 5, and n-type impurity regions 11a and 20b are formed at the surfaces of convex regions 42a and 43b, respectively. Thereafter, the top surfaces of convex regions 41b, 42a and 43b are masked, and p-type impurity such as boron is implanted into semiconductor substrate 1 so that $p^+$-source/drain 9a and 10a are formed at the surface of convex region 41a on n-well 2, and p-type impurity regions 11b and 20a are formed at the surfaces of convex regions 42b and 43a, respectively. In this manner, the structure shown in FIG. 5 is completed.

Then, as shown in FIG. 6, the CVD method or the like is performed to deposit a silicon oxide film covering semiconductor substrate 1, whereby interlayer oxide film 12 is formed. Thereafter, conductive interconnection 13 which is made of, e.g., polycrystalline silicon doped with impurity such as aluminum is formed on the top surface of interlayer oxide film 12 by patterning.

According to the above manufacturing method, p- and n-type impurity regions 20a and 20b at the surface of convex regions 43a and 43b forming the dummy regions are formed simultaneously with the impurity regions forming the potential supplied terminals as well as sources and drains of the transistors formed in the active regions. Therefore, p- and n-type impurity regions 20a and 20b can be formed only by employing an appropriately modified mask pattern without increasing the number of manufacturing steps.

Each of junctions between impurity region 20a and convex region 43a and between impurity region 20b and convex region 43b may not be of the opposite type forming pn junctions, but may be of the same conductivity types, in which case the following operation and effect can be achieved. Each of the capacitor structures, which are provided between the conductive layers and, more specifically, are formed between n-well 2 and impurity region 20 and between p-well 5 and impurity region 20b, results in the structure including the impurity regions which are of the same conductivity type but different impurity concentrations, and are connected together in series. Therefore, the well resistances can be reduced so that a resistance against the latch-up can be improved.

The above structure can be produced by employing a modified mask pattern for impurity implantation in the step of forming the structure shown in FIG. 5, and thereby can be produced substantially similarly to the structure already described without increasing the number of manufacturing steps. More specifically, the top surfaces of convex regions 41a, 42b and 43b are masked, and n-type impurity such as phosphorus is implanted into semiconductor substrate 1 so that $n^+$-source/drain 9b and 10b are formed at the surface of convex region 41b on p-well 5 and n-type impurity regions 11a and 20a are formed at the surfaces of convex regions 42a and 43b, respectively. Thereafter, the top surfaces of convex regions 41b, 42a and 43a are masked, and p-type impurity such as boron is implanted into semiconductor substrate 1 so that $p^+$-source/drain 9a and 10a are formed at the surface of convex region 41a on n-well 2 and p-type impurity regions 11b and 20b are formed at the surfaces of convex regions 42b and 43a, respectively.

Embodiment 2

A semiconductor device of an embodiment 2 will now be described below with reference to FIG. 9.

Figure 9:
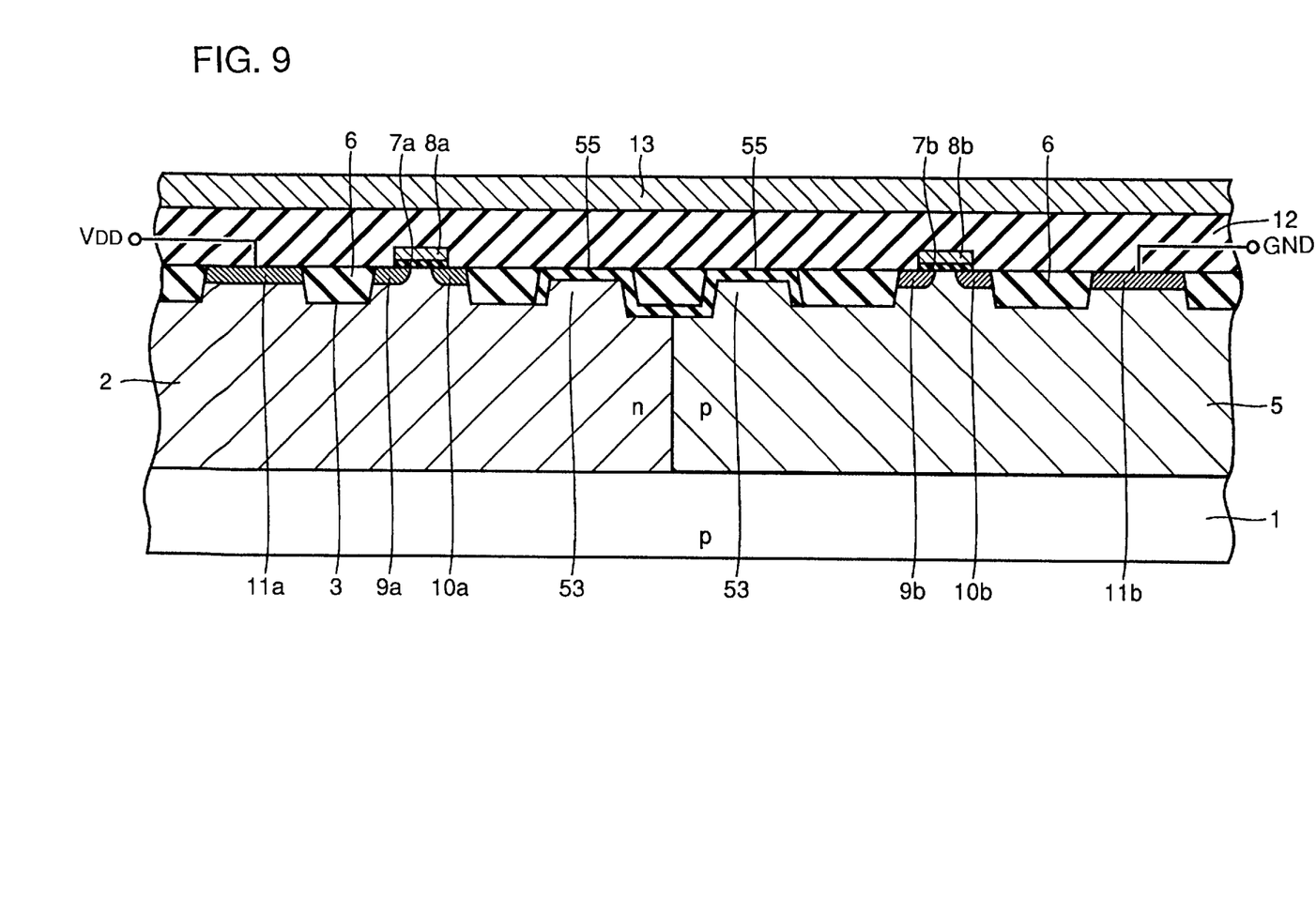
FIG. 9 shows a sectional structure in a step of forming the semiconductor device of the embodiment 2 of the invention having the dummy region, and particularly shows a structure in which the dummy regions have CMOS structures including oxide films.

The semiconductor device of this embodiment differs in structure from the semiconductor device of the embodiment 1 in that the semiconductor device of the embodiment 2 is not provided with impurity regions formed at convex regions 43a and 43b forming the dummy regions in FIG. 6, but includes dummy regions 53 provided with oxide films 55, as shown in FIG. 9.

In this structure, since oxide films 55 have an insulating property, the conductive portions formed of convex regions 53 are spaced from crossing conductive interconnection 13 at a higher position by an increased distance, and the electrically conductive portions are opposed to each other through an increased area. As a result, it is possible to suppress deterioration of electrical characteristics, which may be caused by increase in parasitic capacity of the conductive interconnection and the transistors provided by dummy regions 53.

Figure 7:
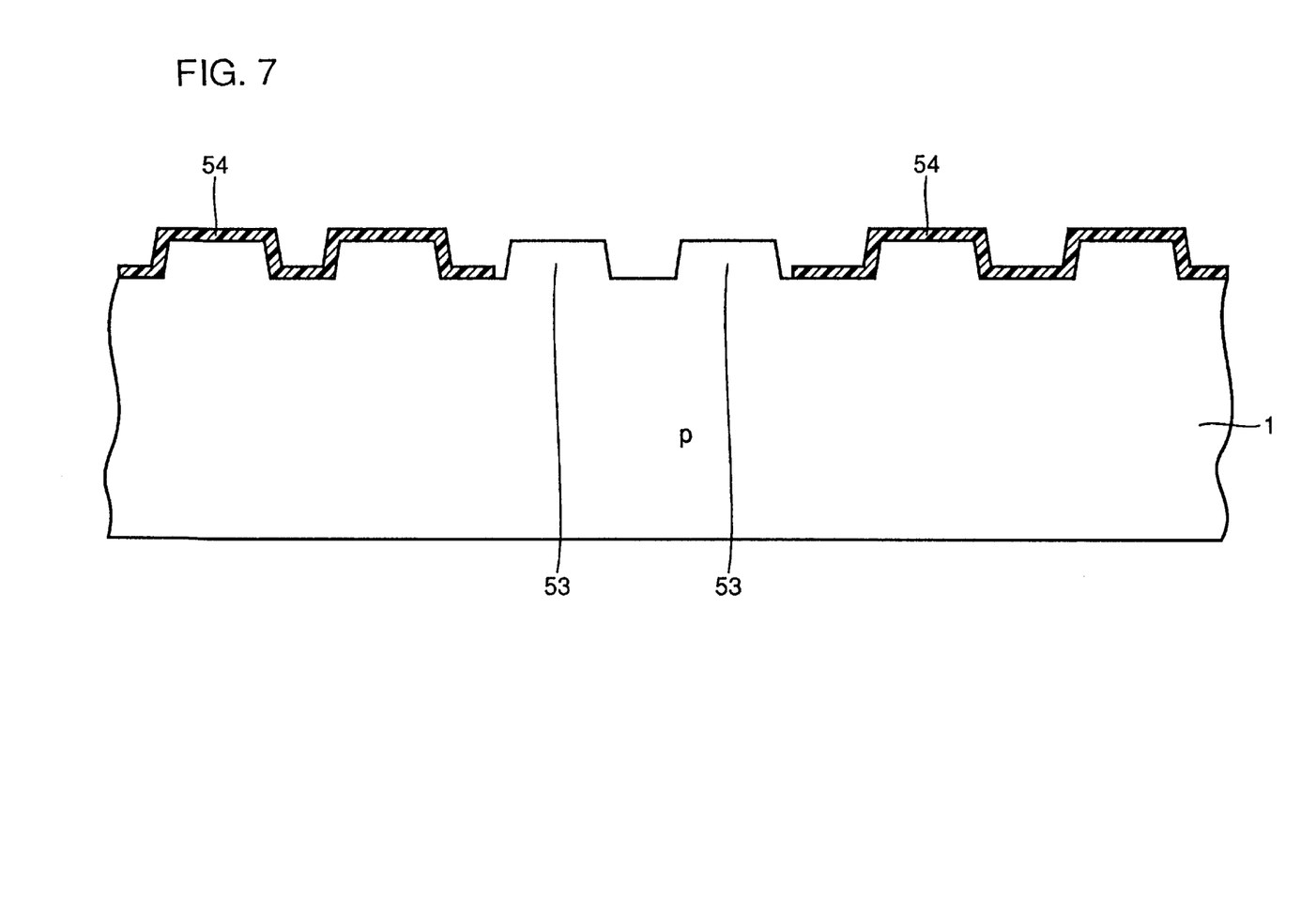
FIG. 7 shows a sectional structure in a step of forming a semiconductor device of an embodiment 2 of the invention having dummy regions, and particularly shows a structure in which regions other than convex regions forming dummy regions are masked with nitride films after forming the convex and concave regions isolated from each other by trenches.
Figure 8:
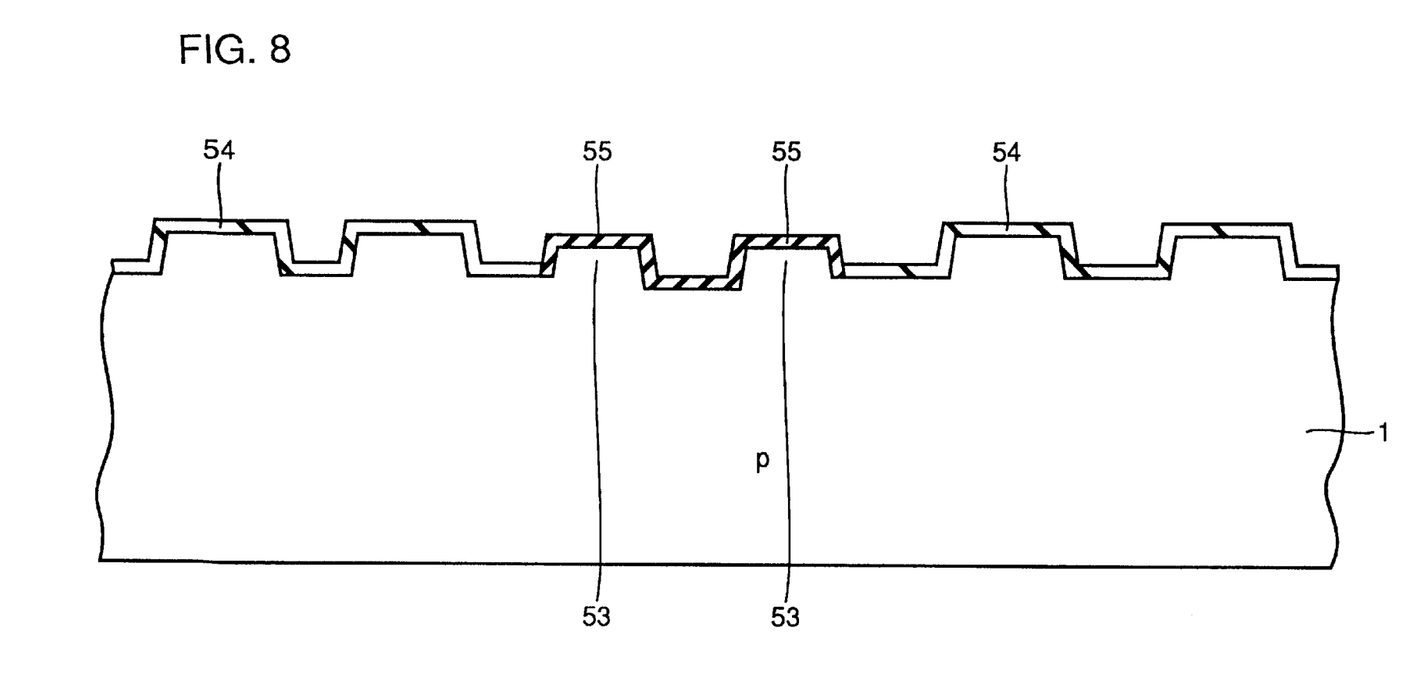
FIG. 8 shows a sectional structure in a step of forming the semiconductor device of the embodiment 2 of the invention having the dummy regions, and particularly shows a structure in which the convex regions forming the dummy regions are oxidized by thermal oxidation.

A method of manufacturing the semiconductor device of this embodiment will now be described below with reference to FIGS. 7 to 9. First, as shown in FIG. 7, a masking layer 54 for anti-oxidation made of a nitride film is formed over the portions other than those which correspond to convex regions 43a and 43b shown in FIG. 1, respectively, using a resist as a mask. Masking layer 54 may be formed of a single layer of nitride, or may be another film such as a layered film made of a nitride film and a thin oxide film. Using masking layer 54 as a mask, thermal oxidation is effected on the surfaces of convex regions 43a and 43b so that dummy regions 53 having oxide films 55 are formed as shown in FIG. 8. Thereafter, steps similar to those of the embodiment 1 are performed to complete the semiconductor device of the CMOS structure shown in FIG. 9. Oxide films 55 may be formed by a method other than the thermal oxidation and, for example, may be formed by exposing convex regions 43a and 43b to an oxidative atmosphere.

According to the above manufacturing method, convex regions 43a and 43b, which have an electrical conductivity with respect to conductive interconnection 13 crossing them and extending at a higher position, can be changed into dummy regions 53 covered with oxide films 55 which are formed by oxidizing the surfaces of the regions 43a and 43b.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising: a semiconductor substrate provided at its main surface with an isolation region isolating an active region; trench isolation provided in said isolation region and including a trench having a predetermined depth from said main surface; and a dummy region leaving said main surface and formed in said isolation region for the purpose of reducing an influence by a difference in level in a later step of forming a semiconductor element on said main surface, wherein said dummy region includes:

a first impurity diffusion region extending a predetermined depth from said main surface and having a predetermined conductivity, and a second impurity diffusion region formed under said first impurity diffusion region, being in contact with the bottom surface of said first impurity diffusion region and having a predetermined conductivity type, wherein the first impurity region is not electrically connected to any interconnection through a contact hole.

2. The semiconductor device according to claim 1, wherein said first and second impurity diffusion regions have opposite conductivity types, respectively.

3. The semiconductor device according to claim 2, wherein said first impurity diffusion region is a p-type impurity diffusion region doped with boron, and said second impurity diffusion region is an n-type impurity diffusion region doped with phosphorus.

4. The semiconductor device according to claim 2, wherein said first impurity diffusion region is an n-type impurity diffusion region doped with phosphorus, and said second impurity diffusion region is a p-type impurity diffusion region doped with boron.

5. The semiconductor device according to claim 1, wherein said first and second impurity diffusion regions have the same conductivity type.

6. The semiconductor device according to claim 5, wherein said first impurity diffusion region is a p-type impurity diffusion region doped with boron, and said second impurity diffusion region is a p-type impurity diffusion region doped with boron.

7. The semiconductor device according to claim 5, wherein said first impurity diffusion region is an n-type impurity diffusion region doped with phosphorus, and said second impurity diffusion region is an n-type impurity diffusion region doped with phosphorus.

8. A semiconductor device comprising a semiconductor substrate provided at its main surface with an isolation region isolating an active region; trench isolation provided in said isolation region and including a trench having a predetermined depth from said main surface; and a dummy region leaving said main surface and formed in said isolation region for the purpose of reducing an influence by a difference in level in a later step of forming a semiconductor element on said main surface, wherein said dummy region includes an oxide film formed by oxidizing the surface of said dummy region and covering the surface of said dummy region.

* * * * *